US009043683B2

(12) United States Patent
Huott et al.

(10) Patent No.: US 9,043,683 B2
(45) Date of Patent: May 26, 2015

(54) ERROR PROTECTION FOR INTEGRATED CIRCUITS

(71) Applicant: International Business Machines Corporation, Armonk, NY (US)

(72) Inventors: William V. Huott, Holmes, NY (US); Kevin W. Kark, Poughkeepsie, NY (US); John G. Massey, Jericho, VT (US); K. Paul Muller, Wappinger Falls, NY (US); David L. Rude, Wendell, NC (US); David S. Wolpert, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 127 days.

(21) Appl. No.: 13/747,896

(22) Filed: Jan. 23, 2013

(65) Prior Publication Data

US 2014/0208184 A1    Jul. 24, 2014

(51) Int. Cl.
*H03M 13/00* (2006.01)
*H03M 13/29* (2006.01)
*H03M 13/05* (2006.01)

(52) U.S. Cl.
CPC .......... *H03M 13/2909* (2013.01); *H03M 13/29* (2013.01); *H03M 13/05* (2013.01)

(58) Field of Classification Search
CPC ...................................................... H03M 13/05
USPC ................................................. 714/758, 777
See application file for complete search history.

(56) References Cited

U.S. PATENT DOCUMENTS

| 3,789,372 A | 1/1974 | Lejon |
| 4,297,598 A | 10/1981 | Smith |
| 4,375,600 A | 3/1983 | Wu |
| 4,464,752 A | 8/1984 | Schroeder et al. |
| 4,653,050 A | 3/1987 | Vaillancourt |
| 4,883,991 A | 11/1989 | Kroner et al. |
| 4,901,320 A | 2/1990 | Sawada et al. |
| 5,012,472 A | 4/1991 | Arimoto et al. |
| 5,164,944 A | 11/1992 | Benton et al. |
| 5,172,339 A | 12/1992 | Noguchi et al. |
| 5,396,100 A | 3/1995 | Yamasaki et al. |
| 5,450,424 A | 9/1995 | Okugaki et al. |

(Continued)

FOREIGN PATENT DOCUMENTS

JP    2008-217926    9/2008

OTHER PUBLICATIONS

Dutta et al., "Multiple Bit Upset Tolerant Memory Using a Selective Cycle Avoidance Based SEC-DED-DAEC Code", Computer Engineering Research Center, 25th IEEE VLSI Test Symposium (VTS'07), 2007, pp. 349-354.

(Continued)

*Primary Examiner* — Esaw Abraham
(74) *Attorney, Agent, or Firm* — Cantor Colburn LLP; William A. Kinnaman, Jr.

(57) ABSTRACT

A method for providing error detection and/or correction to an array of storage cells includes determining a sensitive direction and an insensitive direction of the storage cells and adding a first error control mechanism to the array of storage cells in the insensitive direction. The method also includes adding a second error control mechanism to the array of storage cells in the sensitive direction. The second error control mechanism has a higher Hamming distance than the first error control mechanism.

15 Claims, 5 Drawing Sheets

(56) References Cited

U.S. PATENT DOCUMENTS

| | | | |
|---|---|---|---|
| 5,457,702 A | 10/1995 | Williams et al. |
| 5,572,480 A | 11/1996 | Ikeda et al. |
| 5,592,499 A | 1/1997 | Tanoi |
| 5,650,977 A | 7/1997 | Kyung et al. |
| 5,784,391 A | 7/1998 | Konigsburg |
| 5,787,493 A | 7/1998 | Niijima et al. |
| 5,845,071 A | 12/1998 | Patrick et al. |
| 6,392,945 B2 | 5/2002 | Sato |
| 6,397,364 B1 | 5/2002 | Barkan |
| 6,459,624 B1 | 10/2002 | Kuo |
| 6,838,899 B2 | 1/2005 | Plants |
| 6,900,999 B1 | 5/2005 | Yen et al. |
| 6,928,590 B2 | 8/2005 | Ilkbahar et al. |
| 7,093,208 B2 | 8/2006 | Williams et al. |
| 7,110,275 B2 | 9/2006 | Park |
| 7,143,332 B1 | 11/2006 | Trimberger |
| 7,237,175 B2 | 6/2007 | Hatakenaka et al. |
| 7,339,816 B1 | 3/2008 | Dastidar |
| 7,346,829 B2 | 3/2008 | Riho et al. |
| 7,350,160 B2 | 3/2008 | Perez et al. |
| 7,350,174 B2 | 3/2008 | Srinivasan et al. |
| 7,365,432 B2 | 4/2008 | Liaw |
| 7,389,446 B2 | 6/2008 | Krasnansky |
| 7,397,887 B2 | 7/2008 | Kuhn |
| 7,430,703 B1 | 9/2008 | Schultz |
| 7,461,366 B2 | 12/2008 | Gaul |
| 7,512,921 B2 | 3/2009 | Shibuya |
| 7,523,380 B1 | 4/2009 | Trimberger |
| 7,529,986 B2 | 5/2009 | Riho et al. |
| 7,539,926 B1 | 5/2009 | Lesea |
| 7,574,648 B2 | 8/2009 | Akiyama et al. |
| 7,596,732 B2 | 9/2009 | Branch et al. |
| 7,603,592 B2 | 10/2009 | Sekiguchi et al. |
| 7,606,111 B2 | 10/2009 | Lee et al. |
| 7,638,822 B1 | 12/2009 | de Jong et al. |
| 7,770,072 B2 | 8/2010 | Kondajeri et al. |
| 7,795,900 B1 | 9/2010 | Lesea et al. |
| 7,945,825 B2 | 5/2011 | Cohen et al. |
| 7,966,547 B2 | 6/2011 | Lam |
| 7,975,200 B2 | 7/2011 | Mead |
| 8,006,166 B2 | 8/2011 | Roohparvar et al. |
| 8,010,755 B2 | 8/2011 | Murin |
| 8,042,071 B2 | 10/2011 | Moyer et al. |
| 8,044,437 B1 | 10/2011 | Venkatraman et al. |
| 8,051,358 B2 | 11/2011 | Radke |
| 8,069,307 B2 | 11/2011 | Cornwell et al. |
| 8,069,392 B1 * | 11/2011 | Norrie ........................... 714/758 |
| 8,069,393 B2 * | 11/2011 | Eroz et al. ..................... 714/758 |
| 8,099,688 B2 | 1/2012 | Ellis et al. |
| 8,108,822 B2 | 1/2012 | Voldman |
| 8,151,173 B2 * | 4/2012 | Hirose et al. .................. 714/785 |
| 8,171,380 B2 | 5/2012 | Yang et al. |
| 8,245,100 B2 | 8/2012 | Radke |
| 8,276,046 B2 | 9/2012 | Song et al. |
| 8,370,710 B2 * | 2/2013 | Kim et al. ..................... 714/763 |
| 8,429,492 B2 * | 4/2013 | Yoon et al. .................... 714/763 |
| 8,516,339 B1 | 8/2013 | Lesea et al. |
| 8,560,931 B2 * | 10/2013 | Seshadri et al. .............. 714/801 |
| 8,661,317 B2 | 2/2014 | Jeon et al. |
| 8,713,411 B2 | 4/2014 | Kong et al. |
| 2002/0038440 A1 | 3/2002 | Barkan |
| 2002/0147995 A1 | 10/2002 | Kim et al. |
| 2003/0237069 A1 | 12/2003 | Mohan et al. |
| 2006/0200727 A1 | 9/2006 | Akiyama et al. |
| 2006/0259850 A1 * | 11/2006 | Tomisawa ..................... 714/793 |
| 2008/0034269 A1 | 2/2008 | Hwang et al. |
| 2008/0034272 A1 | 2/2008 | Wu et al. |
| 2008/0313493 A1 | 12/2008 | Roohparvar et al. |
| 2009/0006923 A1 | 1/2009 | Gara et al. |
| 2009/0201748 A1 | 8/2009 | Muraki |
| 2009/0241073 A1 | 9/2009 | Ellavsky et al. |
| 2010/0025761 A1 | 2/2010 | Voldman |
| 2010/0251076 A1 | 9/2010 | Wu et al. |
| 2011/0088008 A1 | 4/2011 | Fifield et al. |
| 2011/0131472 A1 | 6/2011 | Antonakopoulos et al. |
| 2011/0185257 A1 | 7/2011 | Vogelsang |
| 2011/0239093 A1 | 9/2011 | Radke |
| 2011/0309856 A1 | 12/2011 | Cabanas-Holmen et al. |
| 2012/0096330 A1 * | 4/2012 | Przybylski ..................... 714/763 |
| 2012/0278676 A1 | 11/2012 | Teraura |
| 2013/0179754 A1 | 7/2013 | Cherubini et al. |
| 2014/0197863 A1 | 7/2014 | Huott et al. |
| 2014/0201606 A1 | 7/2014 | Huott et al. |
| 2014/0208184 A1 | 7/2014 | Huott et al. |

OTHER PUBLICATIONS

Kishani et al., "HVD: horizontal-vertical-diagonal error detecting and correcting code to protect against with soft errors", Des Autom Embed Syst (2011) 15; pp. 289-310.

Mehrara, et al., "Reliability-Aware Data Placement for Partial Memory Protection in Embedded Processors", MSPC 06, Proceedings of the 2006 workshop on Memory system performance and correctness, 2006 ACM Sigplan, Oct. 22, 2006, Advanced Computer Architecture Lab, University of Michigan, pp. 11-18.

Shamshiri et al., "rror-Locality-Aware Linear Coding to Correct Multi-bit Upsets in SRAMs", International Test Conference, Paper 7.1, 2010 IEEE International, pp. 1-10.

Yao, et al., "Design and Experimental vAlidation of Radiation Hardened by Design SRAM Cells", IEEE Transations on Nuclear Science, vol. 57, No. 1, Feb. 2010; pp. 258-265.

Bhattacharya, et al., "A Framework for Correction of Multi-Bit Soft Errors in L2 Caches Based on Redundancy", IEEE Transactions on Very Large Scale Integration (VLSI) Systems, vol. 17, Issue: 2, 2009, pp. 194-206.

English Translation and Abstract for Japanese Application JP2008217926, published Sep. 18, 2008.

Search Results "Register Banks Length Width Error Control Space Integrated Circuit", IEEE Xplore-Search Results, http://ieeexplore.ieee.org/search/searchresult.jsp?newsearch=true&queryText=register+ba . . . downloaded Dec. 13, 2014; 2 pgs.

* cited by examiner

ERROR PROTECTION FOR INTEGRATED CIRCUITS

BACKGROUND

The present invention relates to integrated circuits, and more specifically, to error protection in integrated circuits including a plurality of storage cells.

As integrated circuits continue to be made smaller many new dependability issues are becoming increasingly important. For example, it has long been known that bit-flip errors in integrated circuits can be caused by alpha particles. As the size of integrated circuits become smaller radiation-induced faults, such as single-event upsets (SEUs) and multi-bit upsets (MBUs), are becoming more common. An SEU or MBU can occur when a particle passes through an integrated circuit. Upon impacting an integrated circuit, the particle may convert its kinetic energy to electrical energy which can be deposited in the circuitry. This energy can affect the state of the circuitry, for example flipping a bit, if the deposited energy exceeds the energy level which is required to hold the correct state. An SEU occurs when a particle changes the state of a single circuit element and an MBU occurs when a particle changes the state of two or more circuit elements. Cosmic rays and other common radiation types can result in SEUs and MBUs in integrated circuits. As integrated circuits continue to decrease in size, lower energies are needed to change the internal state of the circuitry. Therefore, radiation-induced faults are becoming a reliability concern for modern integrated circuits.

Currently faults in integrated circuits, such as MBUs, can be detected and/or corrected through the use of advanced error control techniques. However, such advanced error control techniques require substantial overhead and are accordingly undesirable.

SUMMARY

According to an exemplary embodiment, a method for providing error control to an array of storage cells includes determining a sensitive direction and an insensitive direction of the storage cells and adding a first error control mechanism to the array of storage cells in the insensitive direction. The method also includes adding a second error control mechanism to the array of storage cells in the sensitive direction. The second error control mechanism has a higher Hamming distance than the first error control mechanism.

According to another exemplary embodiment, a computer program product for configuring an array of storage cells includes a tangible storage medium readable by a processing circuit and storing instructions for execution by the processing circuit for performing a method. The method includes determining a sensitive direction and an insensitive direction of the storage cells and adding a first error control mechanism to the array of storage cells in the insensitive direction. The method also includes adding a second error control mechanism to the array of storage cells in the sensitive direction. The second error control mechanism has a higher Hamming distance than the first error control mechanism.

According to further exemplary embodiment, an integrated circuit includes an array of storage cells, wherein each of the storage cells includes a sensitive direction and an insensitive direction. The integrated circuit also includes a first error control mechanism operable for detecting errors in the array of storage cells in the insensitive direction and a second error control mechanism operable for detecting errors in the sensitive direction. The second error control mechanism has a higher Hamming distance than the first error control mechanism.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
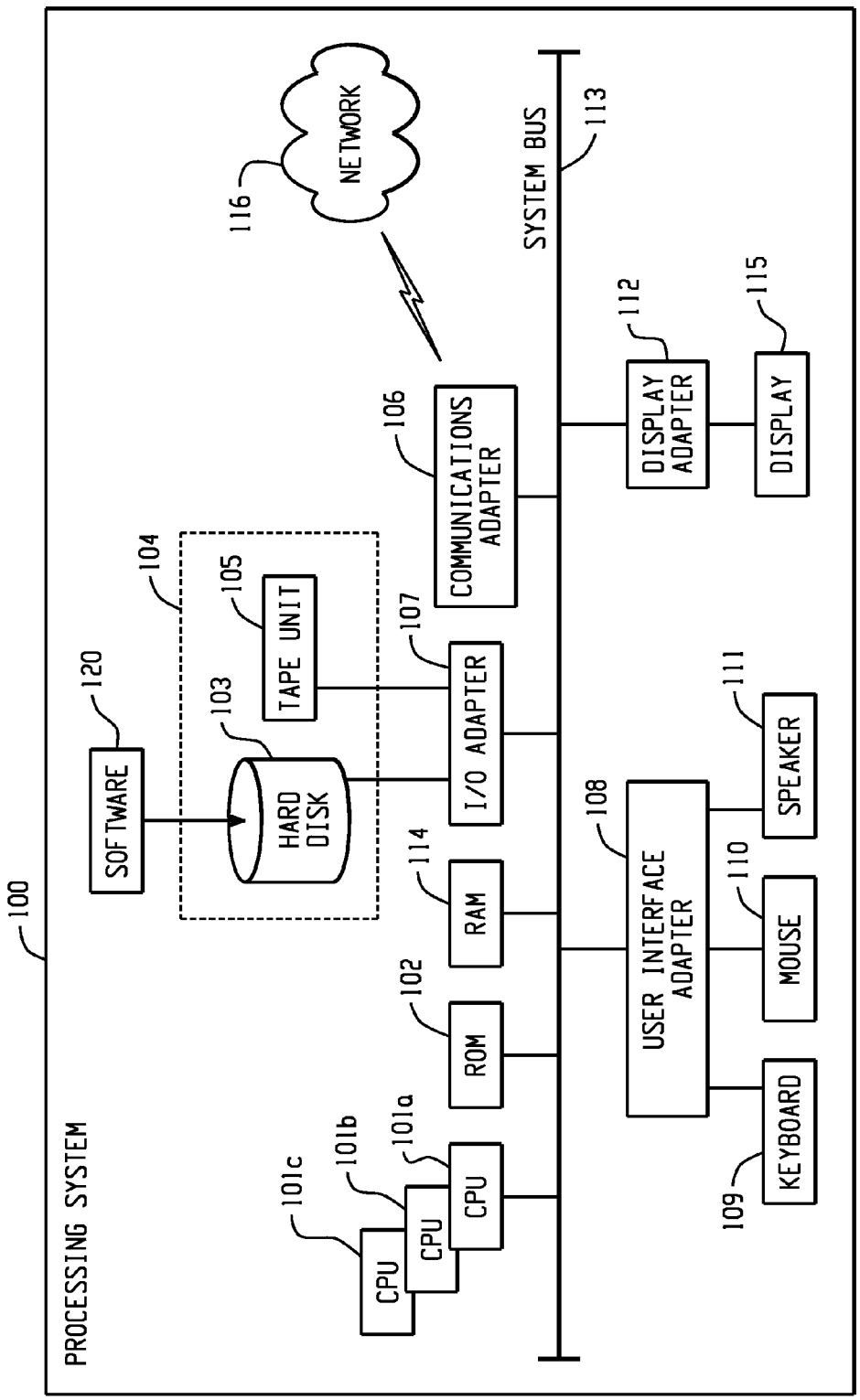
FIG. 1 is a block diagram illustrating one example of a processing system for practice of the teachings herein.

Referring to FIG. 1, there is shown an embodiment of a processing system 100 for implementing the teachings herein. In this embodiment, the system 100 has one or more central processing units (processors) 101a, 101b, 101c, etc. (collectively or generically referred to as processor(s) 101). In one embodiment, each processor 101 may include a reduced instruction set computer (RISC) microprocessor. Processors 101 are coupled to system memory 114 and various other components via a system bus 113. Read only memory (ROM) 102 is coupled to the system bus 113 and may include a basic input/output system (BIOS), which controls certain basic functions of system 100.

FIG. 1 further depicts an input/output (I/O) adapter 107 and a network adapter 106 coupled to the system bus 113. I/O adapter 107 may be a small computer system interface (SCSI) adapter that communicates with a hard disk 103 and/or tape storage drive 105 or any other similar component. I/O adapter 107, a direct access storage device or hard disk 103, and tape storage device 105 are collectively referred to herein as mass storage 104. A network adapter 106 interconnects bus 113 with an outside network 116 enabling data processing system 100 to communicate with other such systems and external storage devices. A screen (e.g., a display monitor) 115 is connected to system bus 113 by display adaptor 112, which may include a graphics adapter to improve the performance of graphics intensive applications and a video controller. In one embodiment, adapters 107, 106, and 112 may be connected to one or more I/O buses that are connected to system bus 113 via an intermediate bus bridge (not shown). Suitable I/O buses for connecting peripheral devices such as hard disk controllers, network adapters, and graphics adapters typically include common protocols, such as the Peripheral Components Interface (PCI). Additional input/output devices are shown as connected to system bus 113 via user interface adapter 108 and display adapter 112. A keyboard 109, mouse 110, and speaker 111 all interconnected to bus 113 via user interface adapter 108, which may include, for example, a Super I/O chip integrating multiple device adapters into a single integrated circuit.

Thus, as configured in FIG. 1, the system 100 includes processing capability in the form of processors 101, storage capability including system memory 114 and mass storage 104, input means such as keyboard 109 and mouse 110, and output capability including speaker 111 and display 115. In one embodiment, a portion of system memory 114 and mass storage 104 collectively store an operating system such as the z/OS® operating system from IBM Corporation to coordinate the functions of the various components shown in FIG. 1.

Examples of operating systems that may be supported by the system 100 include Windows 95, Windows 98, Windows NT 4.0, Windows XP, Windows 2000, Windows CE, Windows Vista, Macintosh, Java, LINUX, and UNIX, z/OS or any other suitable operating system. The system 100 also includes a network interface 116 for communicating over a network. The network can be a local-area network (LAN), a metro-area network (MAN), or wide-area network (WAN), such as the Internet or World Wide Web. Users of the system 100 can connect to the network through any suitable network interface 116 connection, such as standard telephone lines, digital subscriber line, LAN or WAN links (e.g., T1, T3), broadband connections (Frame Relay, ATM), and wireless connections (e.g., 802.11a, 802.11b, 802.11g).

As disclosed herein, the system 100 includes machine readable instructions stored on machine readable media (for example, the hard disk 104) for capture and interactive display of information shown on the screen 115 of a user. As discussed herein, the instructions are referred to as "software" 120. The software 120 may be produced using software development tools as are known in the art. Also discussed herein, the software 120 may also referred to as a "command line testing tool" 120, an "a testing interface" 120 or by other similar terms. The software 120 may include various tools and features for providing user interaction capabilities as are known in the art. The software 120 can include a database management subsystem such as DB2®, which manages structured data access requests and queries from end users and applications.

Figure 2:
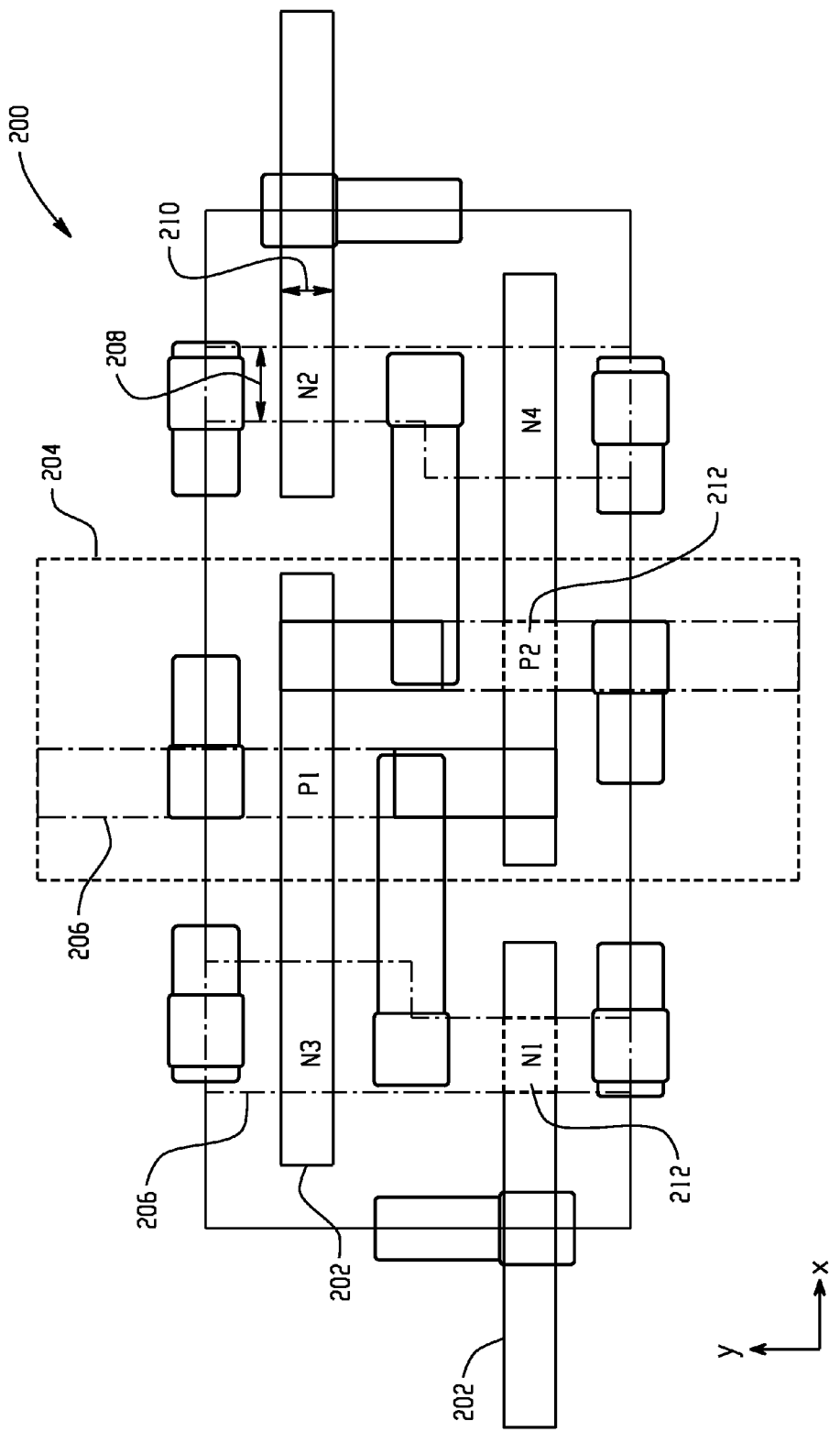
FIG. 2 is a block diagram illustrating an exemplary six-transistor SRAM cell in accordance with an exemplary embodiment of the disclosure.

Referring now to FIG. 2, a schematic illustrating an exemplary six-transistor SRAM cell 200 in accordance with the disclosure is shown. The SRAM cell includes a plurality of gate conductors 202, an n-well region 204 and multiple active regions 206. Active regions 206 that fall within the n-well region 204 are, by definition, p-type devices (PFETs) while active regions 206 that fall outside of the n-well region 204 are n-type devices (NFETs.) The intersection of a gate conductor 202 and an active region 206 defines the transistor of the SRAM cell as shown, for example, by the boxes 212 for a NFET (N1) and a PFET (P2). The gate conductors 202 are configured in such a way as to have a transistor device length 208 in the x-direction and a transistor device width 210 in the direction of the y-axis. As illustrated, the gate conductors 202 of the SRAM cell 200 are configured such that they are substantially parallel to one another in the x-direction. It will be appreciated by those of ordinary skill in the art that the configuration of the SRAM cell 200 illustrated is one of several possible configurations and that the configuration illustrated is not intended to be limiting in anyway.

Figure 3:
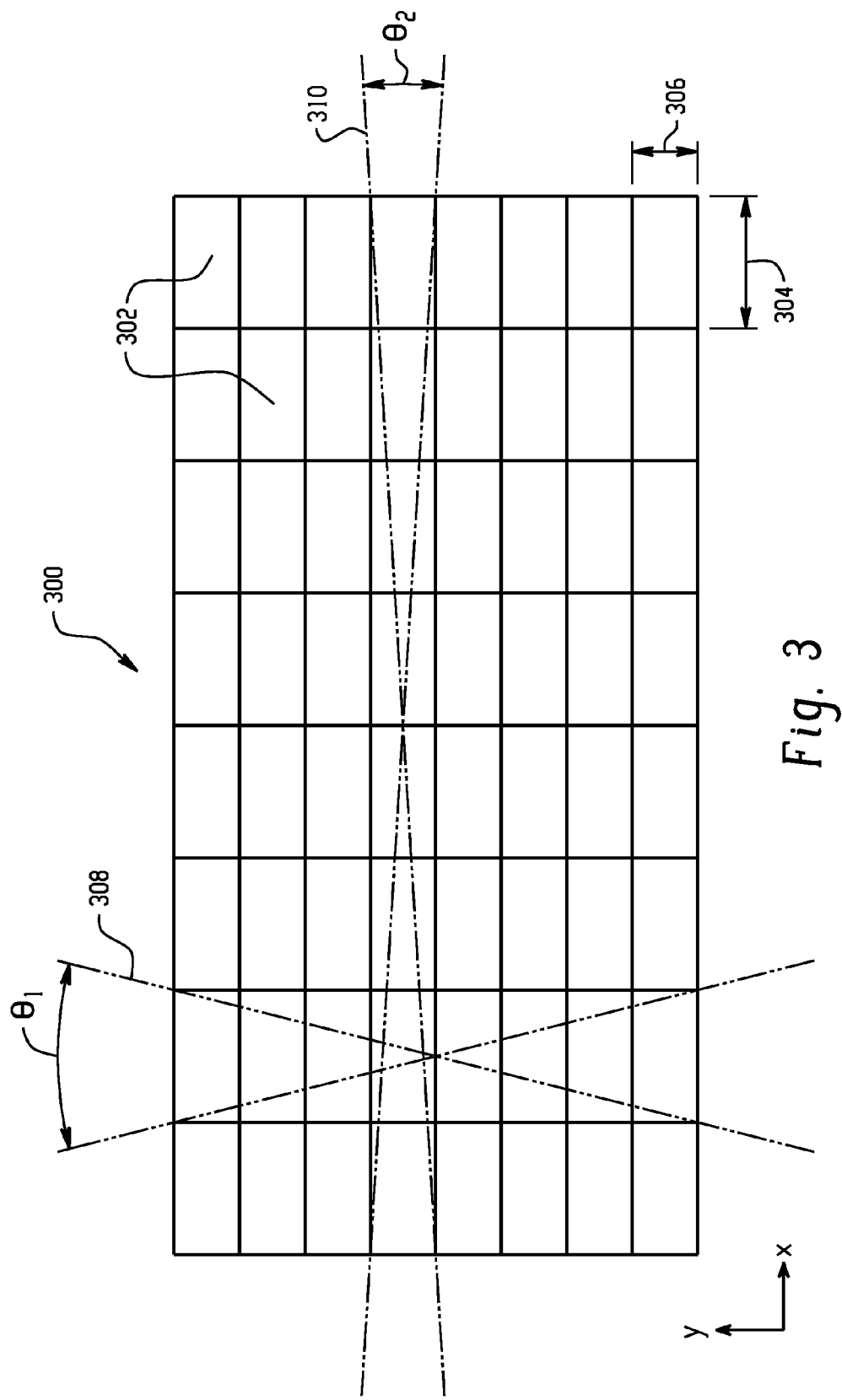
FIG. 3 is a schematic illustrating a two dimensional array of storage cells in accordance with an exemplary embodiment of the disclosure.

FIG. 3 is a schematic illustrating a two dimensional array 300 of storage cells 302, such as the SRAM cell depicted in FIG. 2. In exemplary embodiments, the storage cells 302 may be SRAM cells, latches, register file cells, content-addressable memory cells, flip-flops, DRAM, e-DRAM, or any other storage cell. It will be appreciated by those of ordinary skill in the art that the configuration of the storage cells 302 in the array 300 illustrated is one of several possible configurations and that the configuration illustrated is not intended to be limiting in any way.

During operation of the array 300 of storage cells 302 a particle, or particle beam 308, 310, can impact two or more storage cells 302 thereby causing a multi-bit upset ("MBU"). Due to the dimensions of the gates of storage cells 302, particularly the difference in the length 304 and width 306 of the gates, a particle, or particle beam 308, traveling generally in the y-direction has a much higher likelihood of impacting a plurality of storage cells 302 and causing an MBU as compared to a particle, or particle beam 310, traveling generally in the x-direction. In exemplary embodiments, the range of the angles that a particle or particle beam 308 can strike the storage cells gates in the array 300 in the y-direction and cause an MBU can be represented by $\Theta_1$ and the range of the angles that a particle or particle beam 310 can strike the storage cells gates in the array 300 in the x-direction and cause an MBU can be represented by $\Theta_2$. In exemplary embodiments, when the length 304 of the gates of the storage cells 302 is greater than the width 306 of the gates of the storage cells 302, $\Theta_1$ will be greater than $\Theta_2$. In addition, the probability that a particle will cause an MBU in a given direction, for example the y-direction, is proportional to the range of the angles, for example $\Theta_1$. The different probabilities of MBUs in each direction may be further compounded by the difference in length and width of the gate conductors, which may have length-width ratios larger than 10.

Since the likelihood of experiencing an MBU due to a particle beam in the y-direction is higher than in the x-direction, the y-direction is referred as a sensitive direction of the array 300 and the x-direction is referred to as an insensitive direction of the array 300. In exemplary embodiments, the sensitive direction of the array 300 of storage cells 302 can be defined as being perpendicular to the length 304 of storage cell gates and the insensitive direction of the array 300 of storage cells 302 can be defined as being perpendicular to the width 306 of the storage cell gates. In exemplary embodiments, the sensitive direction of the array 300 of storage cells can be defined as being perpendicular to the length 208 of the gate conductor 202 and the insensitive direction of the array 300 of storage cells 302 can be defined as being perpendicular to the width 210 of the gate conductor 202.

Figure 4:
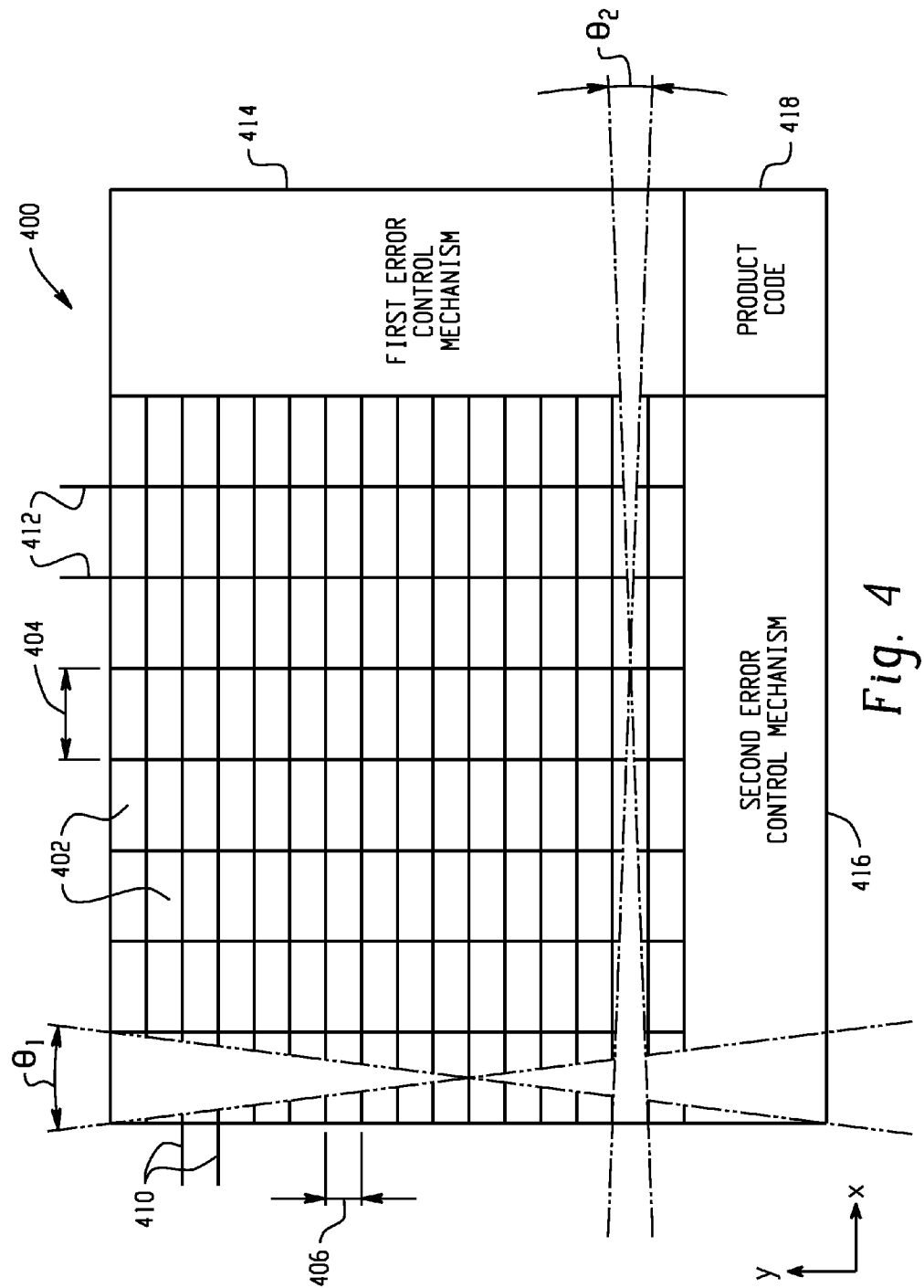
FIG. 4 is a schematic illustrating a two dimensional array of storage cells including a first and second error control mechanism in accordance with an exemplary embodiment of the disclosure.

Referring now to FIG. 4, a memory array 400 including a plurality of storage cells 402 is shown. The storage cells 402 each have a length 404 and a width 406, which is less than the length 404. In exemplary embodiments, the storage cells 402 are each connected to word lines 410, which run generally in the x-direction, and bit lines 412, which run generally in the y-direction. Based on the configuration of the storage cells 402 in the array 400, the word lines 410 are determined to be in the insensitive direction and the bit lines 412 are in the sensitive direction. Once the sensitive and insensitive directions of the array 400 of storage cells are determined, a first error control mechanism 414 is added to the array 400 such that the first error control mechanism 414 is configured to detect or correct errors that occur in the insensitive direction and a second error control mechanism 416 is added to the array 400 such that the second error control mechanism 416 is configured to detect or correct errors that occur in the sensitive direction. In exemplary embodiments, the first error control mechanism 414 is selected to be a weaker error control mechanism than the second error control mechanism 416 due to the probability of experiencing MBUs in the word lines 410 being less than the probability of experiencing MBUs in the bit lines 412.

In exemplary embodiments depending upon the application and the level of error protection desired the first error control mechanism 414 and second error control mechanism 416 may include a parity protection bit, an error control coding ("ECC") circuit, or another form of error detection and correction. In general, parity protection provides single-bit error detection, but it does not handle even numbers of multi-bit errors, and provides no way to correct detected errors. Advanced error detection and correction protocols, such as single-error correction double-error detection codes, are capable of detecting both single-bit and multi-bit errors and correcting single-bit errors. These protocols use a special algorithm to encode information in a block of bits that contains sufficient detail to permit the recovery of one or more bit errors in the data. Unlike parity protection, which uses a single bit to provide protection to some number of bits, ECC circuits may use larger groupings such as 7 bits to protect 32 bits, or 8 bits to protect 64 bits. In general, the strength of an error control mechanism is represented by the Hamming distance of the error control mechanism, which indicates the minimum number of binary digits that differ between any two code words in the code.

In exemplary embodiments, the array 400 may also include a product code 418, which may be the second error control mechanism 416 applied to the bits of the first error control mechanism 414. The product code 418, also known as rectangular or concatenated codes, can be used to provide additional protection to the memory array 400 from errors. The product code 418 can achieve superior error correction and/or detection capabilities compared to only placing error control mechanisms on one direction of the memory array 400. In general, the Hamming distance of a product code is equal to the product of the Hamming distance of the error control mechanisms on the horizontal and vertical directions of the memory array 400. As the Hamming distance increases the number of errors that can be detected and corrected in the memory array 400 also increases. In exemplary embodiments, the detectable number of errors is in a memory array 400 is equal to the Hamming distance minus one and the correctable number of errors in a memory array 400 is half of the detectable number of errors rounded down. For example, a Hamming code that has a Hamming distance of three has a detectable number of errors of two and a correctable number of errors of one.

In exemplary embodiments, by placing error control mechanisms having different strengths on each dimension of a memory array 400 based on the probability of MBUs for each dimension of an array, the effectiveness of the error protection resources can be optimized. In addition, the effectiveness of the error protection resources can be further optimized by utilizing a product code. In one embodiment, the first error control mechanism 414 may be selected to be a parity protection bit with a Hamming distance of two and the second error control mechanism 416 can be selected to be an ECC with a Hamming distance of four, which results in the product code 418 having a Hamming distance of eight.

In exemplary embodiments, the second error control mechanism 416 configured to detect and/or correct errors in the sensitive direction is selected to be stronger than the first error control mechanism 414 configured to detect and/or correct errors in the insensitive direction. By applying a stronger error control mechanism for the sensitive direction and a weaker error control mechanism for the insensitive direction the overall reliability and speed of the combined error protection is increased and the use of the available error control resources can be optimized without negatively impacting performance.

Figure 5:
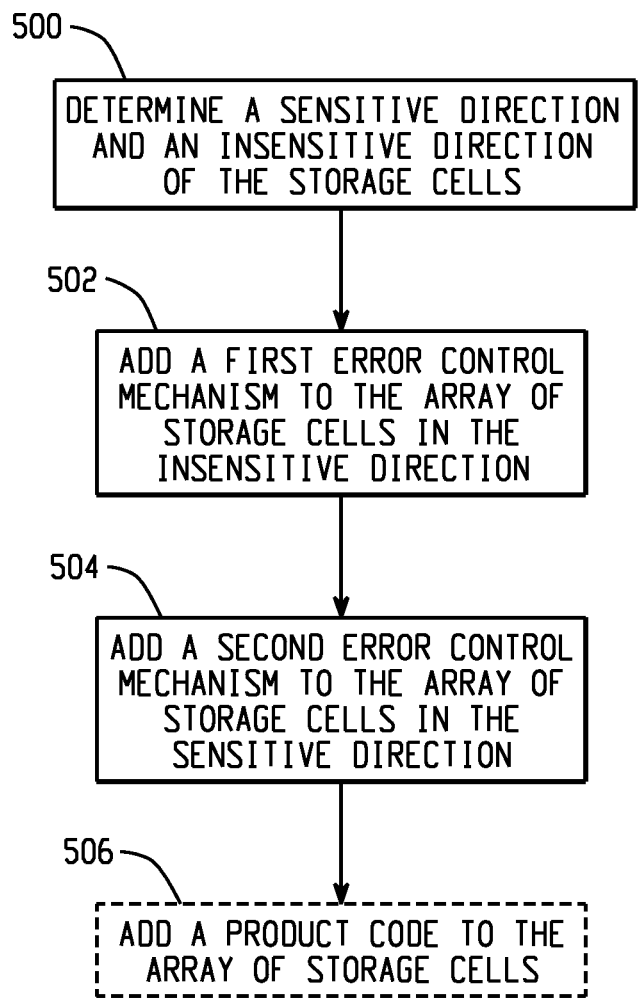
FIG. 5 is a flow diagram that illustrates a method for adding error control to an array of storage cells in accordance with an exemplary embodiment.

Referring now to FIG. 5, a flow diagram that illustrates a method for providing error control to an array of storage cells in accordance with an exemplary embodiment is shown. As illustrated at block 500, the method includes determining a sensitive direction and an insensitive direction of the storage cells. The sensitive direction is determined to be a direction perpendicular to a length of the storage cells. As shown at block 502, the method includes adding a first error control mechanism to the array of storage cells configured to detect errors that occur in the insensitive direction. As shown at block 504, the method includes adding a second error control mechanism to the array of storage cells configured to detect errors that occur in the sensitive direction. In exemplary embodiments, the second error control mechanism has a higher Hamming distance than the first error control mechanism. As shown at block 506, the method may also include adding a product code to the array of storage cells.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for providing error detection or correction to an array of storage cells comprising:
   determining a sensitive direction and an insensitive direction of the storage cells;
   adding a first error control mechanism to the array of storage cells in the insensitive direction; and
   adding a second error control mechanism to the array of storage cells in the sensitive direction, wherein the storage cells comprise a length and a width that is smaller than the length, and wherein the sensitive direction is a direction perpendicular to the length of the storage cells;
   wherein the second error control mechanism has a higher Hamming distance than the first error control mechanism.

2. The method of claim 1, wherein the first error control mechanism is a parity protection bit or other error control coding method.

3. The method of claim 1, wherein the second error control mechanism has a Hamming distance of at least three.

4. The method of claim 1, further comprising adding a product code to the memory array, wherein the product code includes applying the second error control mechanism to a plurality of bits of the first error control mechanism.

5. The method of claim 1, wherein the storage cells comprise at least one of the following: SRAM cells; latches; register file cells; content-addressable memory cells; DRAM; e-DRAM; and flip-flops.

6. A computer program product for configuring an array of storage cells, the computer program product comprising:
a non-transitory computer readable storage medium having computer readable program code embodied therewith, the computer readable program code comprising:
computer readable program code configured to:
determine a sensitive direction and an insensitive direction of the storage cells;
add a first error control mechanism to the array of storage cells in the insensitive direction; and
add a second error control mechanism to the array of storage cells in the sensitive direction, wherein the storage cells comprise a length and a width that is smaller than the length, and wherein the sensitive direction is a direction perpendicular to the length of the storage cells;
wherein the second error control mechanism has a higher Hamming distance than the first error control mechanism.

7. The computer program product of claim 6, wherein the first error control mechanism is a parity protection bit.

8. The computer program product of claim 6, wherein the second error control mechanism has a Hamming distance of at least three.

9. The computer program product of claim 6, wherein the computer readable program code is further configured to add a product code to the memory array, wherein the product code includes applying the second error control mechanism to a plurality of bits of the first error control mechanism.

10. The computer program product of claim 6, wherein the storage cells comprise at least one of the following: SRAM cells; latches; register file cells; content-addressable memory cells; DRAM; e-DRAM; and flip-flops.

11. The computer program product of claim 6, wherein each error control mechanism is optimized for a given reliability target depending upon a multi-bit error probability of a particular direction.

12. An integrated circuit comprising:
an array of storage cells, wherein the storage cells comprise a sensitive direction and an insensitive direction;
a first error control mechanism operable for detecting errors in the array of storage cells in the insensitive direction; and
a second error control mechanism operable for detecting errors in the sensitive direction, wherein the storage cells comprise a length and a width that is smaller than the length, and wherein the sensitive direction is a direction perpendicular to the length of the storage cells;
wherein the second error control mechanism has a higher Hamming distance than the first error control mechanism, wherein the second error control mechanism has a Hamming distance of at least three.

13. The integrated circuit of claim 12, wherein the first error control mechanism is a parity protection bit.

14. The integrated circuit of claim 12, further comprising:
a product code, wherein the product code includes applying the second error control mechanism to a plurality of bits of the first error control mechanism.

15. The integrated circuit of claim 12, wherein the storage cells comprise at least one of the following: SRAM cells; latches; register file cells; content-addressable memory cells; DRAM; e-DRAM; and flip-flops.

* * * * *